United States Patent [19]

Wojnarowski et al.

[11] Patent Number: 5,302,547

[45] Date of Patent: Apr. 12, 1994

[54] SYSTEMS FOR PATTERNING DIELECTRICS BY LASER ABLATION

[75] Inventors: Robert J. Wojnarowski, Ballston Lake; Herbert S. Cole, Burnt Hills; Richard J. Saia, Schenectady; Thomas B. Gorczyca, Schenectady; Ernest W. Balch, Ballston Spa, all of N.Y.

[73] Assignee: General Electric Company, Schenectady, N.Y.

[21] Appl. No.: 14,609

[22] Filed: Feb. 8, 1993

[51] Int. Cl.⁵ .................... H01L 21/283; H01L 21/306
[52] U.S. Cl. ........................ 437/173; 156/643; 156/656; 219/121.68; 437/235
[58] Field of Search ................ 437/235, 173, 245; 219/121.68, 121.69; 427/53.1; 156/643, 656

[56] References Cited

U.S. PATENT DOCUMENTS

| | | | |
|---|---|---|---|
| 4,783,695 | 11/1988 | Eichelberger et al. | 357/65 |
| 4,835,704 | 5/1989 | Eichelberger et al. | 364/490 |
| 4,894,115 | 1/1990 | Eichelberger et al. | 156/643 |
| 5,073,814 | 12/1991 | Cole, Jr. et al. | 357/54 |
| 5,130,229 | 7/1992 | Chang et al. | 430/312 |
| 5,173,442 | 12/1992 | Carey | 437/173 |

*Primary Examiner*—Olik Chaudhuri
*Assistant Examiner*—Ken Horton
*Attorney, Agent, or Firm*—Geoffrey H. Krauss

[57] ABSTRACT

A differentiable ablation approach to patterning dielectrics which are not of the same absorbance uses an absorbant dielectric at a specified laser wavelength over a non-absorbant dielectric at that wavelength. The absorbant dielectric may be laser-patterned and become an integral mask enabling plasma etching of the underlying non-absorbant dielectric. If the patterning of the absorbant dielectric involves vias, polymer ridges formed around via surfaces during laser patterning may be removed at the same time the underlying non-absorbant dielectric is etched using a transparent, oxygen plasma resistant mask. Alternatively, an inert mask may be used instead of the absorbant dielectric to allow plasma etching of the non-absorbant dielectric.

2 Claims, 21 Drawing Sheets

SYSTEMS FOR PATTERNING DIELECTRICS BY LASER ABLATION

BACKGROUND OF THE INVENTION

1. Field of the Invention

This invention relates generally to patterning of polymers. More particularly, this invention relates to patterning of polymers in a high density interconnect process in such a way as to allow use of low dielectric constant polymers, and to remove any polymer ridges which may be formed around pattern openings.

2. Description of the Related Art

Materials such as TEFLON polytetrafluoroethylene (Teflon is a trademark of E.I. duPont de Nemours and Co.) and other fluorocarbon polymers have highly desirable properties in the manufacture of high density interconnect (HDI) circuits. Polytetrafluoroethylene has one of the lowest dielectric constants in the polymer field, optical clarity, and excellent chemical and temperature stability. However, laser patterning of fluorocarbon polymers is hindered because the various fluorocarbon polymer derivatives are transparent to light of wavelengths generally greater than 200 nm. Thus, the use of continuous wave (CW) scanning lasers for patterning and ablation that are in the 350-360 nm range have been ineffective.

Commonly assigned Cole et al., U.S. application Ser. No. 07/936,496, filed Aug. 28, 1992, entitled "Laser Ablatable Polymer Dielectrics and Methods," discloses a method of doping polyesters with a small amount of dye to make them absorb at the desired wavelength. Polytetrafluoroethylene, however, is not solventable (i.e., does not dissolve in any known solvent), and therefore this approach of doping with a molecule in a common solvent will not work. It is possible to heat polytetrafluoroethylene above its melting point and blend in absorbing dyes, but, because this melting would require processing at elevated temperatures (in excess of 275° C.), and the dyes used are not thermally stable at these temperatures, it is not practiced.

Another limitation on the use of fluorocarbon polymers in conventional procedures is the fact that metal does not readily adhere to the surface. Thus, it is difficult to pattern electrical connections on a polytetrafluoroethylene surface.

Commonly assigned Cole et al., U.S. Pat. No. 5,073,814, issued Dec. 17, 1991, discloses use of a multilayer composite of alternating thin layers of KAPTON polyimide (Kapton is a trademark of E.I. duPont de Nemours and Co.) and TEFLON polytetrafluoroethylene as a means to provide sufficient absorption of optical energy in the bulk of the layer to allow laser ablation. This process provides a lower dielectric constant than prior techniques while allowing for adhesion and laser drilling; however, it requires many repetitive depositions and does not provide all of the advantages of a pure form of polytetrafluoroethylene.

In high frequency applications, the use of high dielectric constant materials limits the present HDI process. Specifically, high dielectric constant materials (i.e., $\epsilon$ about 3.0) applied over chips contribute additional capacitance loading to the chips at high frequencies and thus alter the design performance of the chips. Improved propagation and reduced capacitive coupling are obtained with TEFLON polytetrafluoroethylene ($\epsilon$ about 2.0) because of its significantly lower dielectric constant. Additionally, video array chips need to have their viewing windows cleared of light blocking polymer materials to achieve proper optical response. Localized ablation has been used to clear polymers off of sensitive areas of chips; however, direct laser ablation on the chip surface sometimes damages the chip. Since TEFLON polytetrafluoroethylene is transparent down to 209 nm, this ablation damage can be reduced while still achieving optically clear layers.

Commonly assigned Eichelberger et al., U.S. Pat. No. 4,835,704, issued May 30, 1989, which is herein incorporated by reference, discloses a method for performing HDI adaptive lithography which allows unique processing of multi-chip modules with non-precision chip placement. The imprecision in placement is calculated by a computer and then written directly into photoresist without a mask using a CW argon ion scanning laser dither system.

Polymers that absorb light at wavelengths of approximately 350-360 nm work well with this CW argon ion laser system. The laser energy is absorbed by the polymer and locally heats the polymer to temperatures where thermal decomposition or ablation occurs. At these wavelengths there are other polymers, including fluorocarbon polymers such as polytetrafluoroethylene, which do not absorb incident energy and therefore cannot be readily ablated. Since polytetrafluoroethylene has essentially no absorption at wavelengths above 200 nm, both CW and pulsed excimer lasers at all wavelengths above 200 nm will not effectively ablate this material, thus limiting its use as a low dielectric constant interlayer dielectric for HDI adaptive lithography in which an adaptive laser is employed for via fabrication.

The process of via formation by adaptive lithography using laser dithering can cause extreme localized heating of the surrounding polymer and can put the polymer under stress and result in melting or flowing of the material. In the case of KAPTON polyimide, the stress caused by via dithering often results in the formation of a substantial polymer ridge around the surface perimeter of the via. Exposure of the via to excimer lasers or ashing procedures replicates the surface topography further down into the polymer, leaving the ridge intact. Subsequent metallization causes a much larger metal ridge to form around the via perimeter because of excessive electroplating in this area, due to high electric field density areas. Subsequent patterning of the metal around the via becomes difficult because of thin or incomplete resist coverage over the metal ridge, allowing etchants to attack the via metal. Additionally, the metal ridge can form shorts between metal levels, due to thinning of dielectrics.

SUMMARY OF THE INVENTION

Accordingly, one object of the invention is to provide a patternable integral mask (preferably using adaptive lithography) that enables the patterning of non-laser absorbing materials such as polytetrafluoroethylene and other fluorinated polyethylenes.

Another object of the invention is to provide a method of fabricating low dielectric constant structures for use as high density interconnect layers in multi-chip module applications.

Still another object of the invention is to provide a method of fabricating structures suitable for use in video arrays.

Yet another object of the invention is to provide a process for adhering metal to a dielectric layer consisting essentially of material to which the metal under normal use does not adhere.

Another object of the invention is to provide a method to remove the dielectric ridge which forms around a via surface perimeter in a dielectric layer during laser dithering.

The invention accomplishes the above objects by employing a differentiable ablation method of patterning materials which are not all of the same absorbance using, in one embodiment, an absorbant material, such as KAPTON polyimide, over non-absorbant material, such as TEFLON polytetrafluoroethylene. KAPTON polyimide is easily patterned by the adaptive lithography method, and this patterned polyimide becomes an integral mask that enables precision, selective, differential etching by methods such as RIE (reactive ion etching) of the underlying, nonablated material. In a modification of this embodiment, a non-absorbant material, such as silicon nitride, may overlie the absorbant layer. This overlying non-absorbant material is patterned simultaneously with the absorbant layer by the adaptive lithography method, and these patterned layers become an integral mask that enables precision, selective, differential etching by methods such as RIE of both the absorbant material and the underlying non-absorbant material.

Briefly, in accordance with a preferred embodiment of the invention, an opening is fabricated in a first dielectric layer which is not itself laser ablatable at a given laser wavelength by providing a second dielectric layer which is laser ablatable at the given laser wavelength, overlying the first dielectric layer. An opening is provided in the second dielectric layer by laser ablation. An opening aligned with the opening in the second dielectric layer is etched in the first dielectric layer, using the second layer as an etch mask.

According to another preferred embodiment of the invention, an inorganic optically transparent mask is deposited over an optically absorbing polymer material overlying an optically non-absorbing polymer material to form a structure that is patternable by an adaptive masking technique. Laser ablation patterning of the absorbing polymer material ablates the overlying mask in the same area, providing an integral opening. An opening is etched in the nonabsorbing polymer material, aligned with the opening in the absorbing polymer material, without loss of dielectric thickness.

According to another preferred embodiment of the invention, an inorganic optically transparent hard mask is deposited over an ablatable polymer material to form a structure that is patternable by an adaptive masking technique. This method is used for removing a polymer ridge formed around a via surface. A via is provided through the hard mask and polymer layer. The exposed portion of the polymer layer in the area of the hard mask is isotropically etched. The hard mask is then removed from the polymer layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals representing like components, in which:

DETAILED DESCRIPTION OF A PREFERRED EMBODIMENT OF THE INVENTION

Figure 1A:
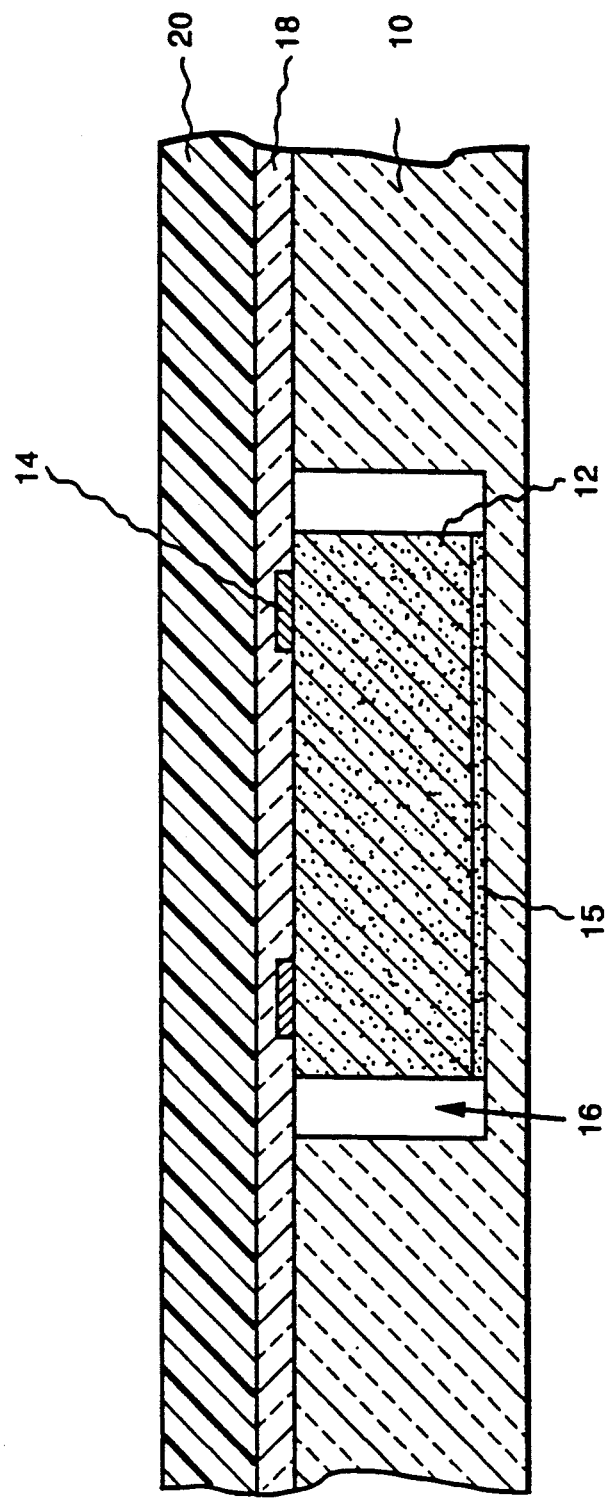
FIG. 1(a) is a sectional side view of a first dielectric layer overlying a chip in a substrate well and a second dielectric layer overlying the first dielectric layer.

FIG. 1(a) is a sectional side view of a chip 12 with pads 14 attached to a substrate 10 in well 16. Chip 12 may comprise an integrated circuit chip or a discrete circuit component and can be attached to the substrate by adhesive 15. Substrate 10 may comprise any structural material and, in a preferred embodiment, comprises a ceramic such as alumina. The chip and substrate are overlaid by a first dielectric layer 18, which, in turn, is overlaid by a second dielectric layer 20. First dielectric 18 has a lower dielectric constant than second dielectric layer 20. Second dielectric layer 20 is selected to be ablatable at commercially available laser wavelengths and in one embodiment may comprise KAPTON polyimide. First dielectric layer 18, with low dielectric constant and low optical absorption above 200 nm, is not ablatable at commercially available laser wavelengths in the 350–360 nm range. In one embodiment, first dielectric layer 18 may comprise TEFLON polytetrafluoroethylene. Additional examples of materials for first dielectric layer 18 include polyesters and other fluorocarbon polymers.

The two layers 18 and 20 may comprise a double laminate film, such as Dupont F type and XP type KAPTON polyimide-TEFLON polytetrafluoroethylene products. Alternatively, either a single laminate film such as Dupont FEP and PFA series TEFLON polytetrafluoroethylene may be covered by a layer of KAPTON polyimide, or liquid TEFLON polytetrafluoroethylene such as Dupont AF series may be used in combination with a high absorbance film or a spun-on high absorbance material such as silicone polyimide or ULTEM polyetherimide resin (ULTEM is a registered trademark of General Electric Company, Pittsfield, MA).

Figure 1B:
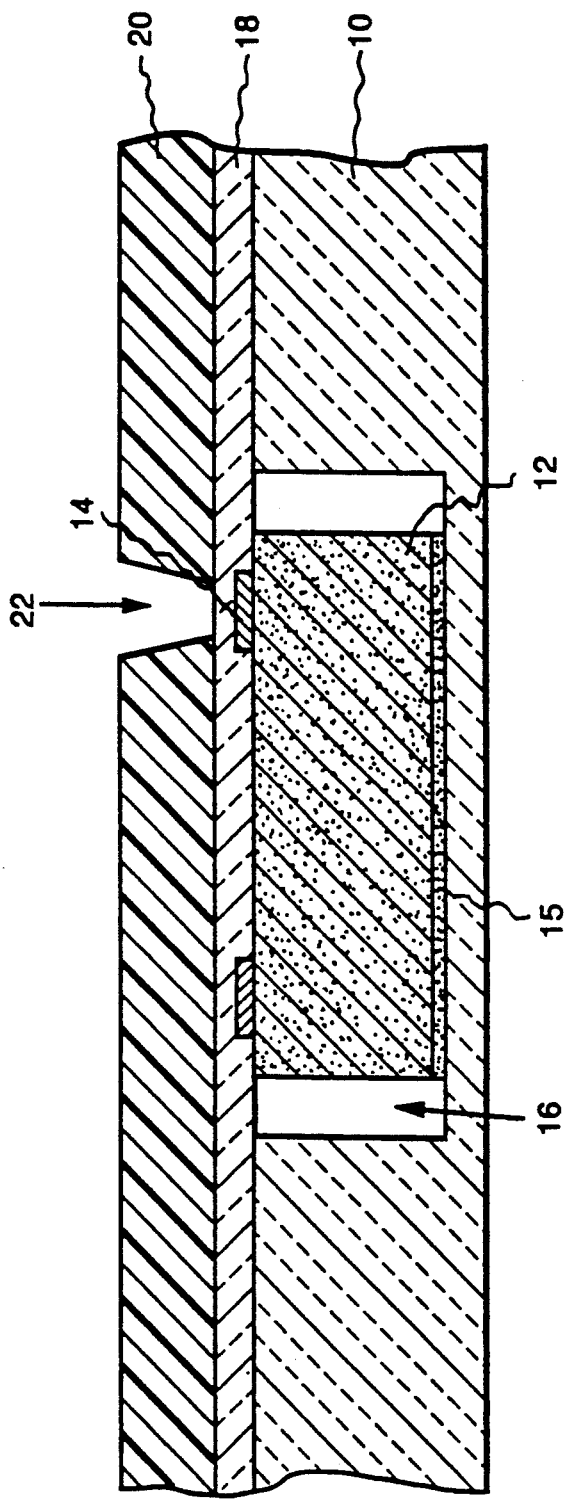
FIG. 1(b) is a view similar to that of FIG. 1(a), with a laser dithered hole through the second dielectric layer.

FIG. 1(b) is a view similar to that of FIG. 1(a), with a laser dithered hole 22 through second dielectric layer 20. Methods for laser dithering are disclosed in Eichelberger et al., U.S. Pat. No. 4,783,695, issued Nov. 8, 1988, and Eichelberger et al., U.S. Pat. No. 4,894,115, issued Jan. 16, 1990, both of which are commonly assigned and herein incorporated by reference. Because of the different absorbancies of the materials, when second dielectric layer 20 is laser dithered, the first dielectric layer 18 is undisturbed.

Figure 1C:
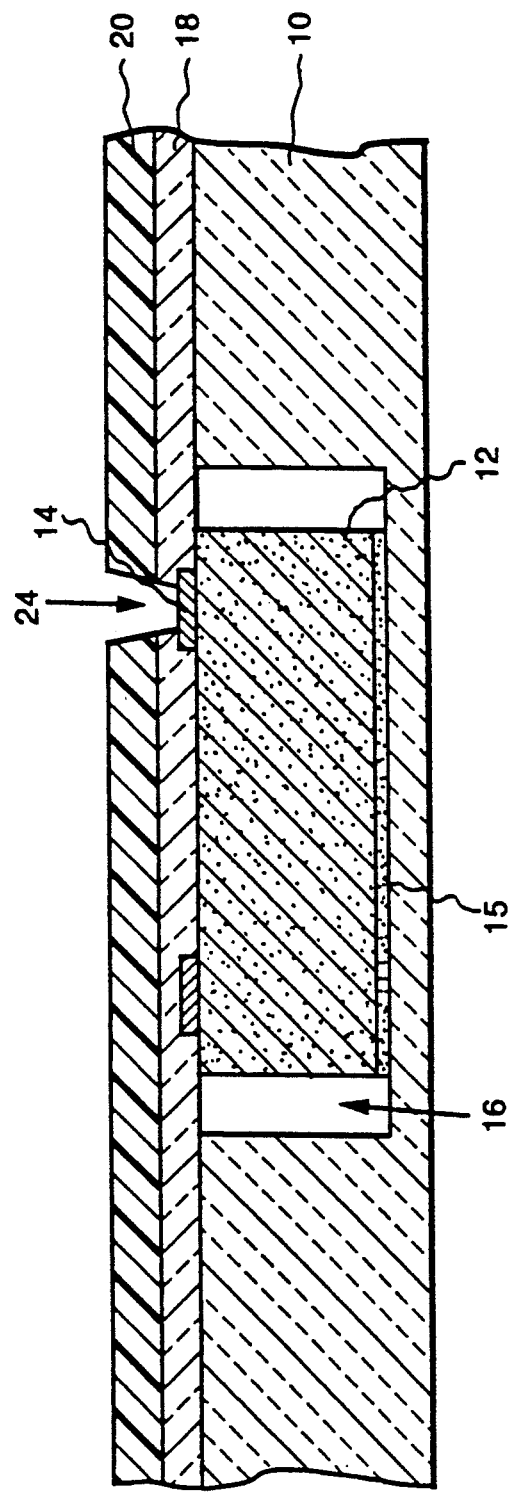
FIG. 1(c) is a view similar to that of FIG. 1(b), with a via extending through both the second dielectric layer (which has been thinned) and the first dielectric layer.

FIG. 1(c) is a view similar to that of FIG. 1(b), with an opening extending through both second dielectric layer 20 and first dielectric layer 18. In FIG. 1(c) the opening is a via 24 exposing chip pad 14; the invention, however, extends to any type of opening, including large area openings, and is not limited to vias. Preferably this opening through first dielectric layer 18 is formed by RIE (reactive ion etching). During this process, the entire top surface of the second dielectric layer 20 is exposed and thus etched to result in a thinner second dielectric layer. The resulting thickness of second dielectric layer 20 can be controlled by adjusting the initial thickness as well as RIE etch time or etch chemistry. HDI assemblies are generally exposed to an $O_2/CF_4$ plasma before metallization to clear laser debris. RIE accomplishes removal of laser soot while etching through first dielectric layer 18.

In one embodiment where first dielectric layer 18 comprises TEFLON polytetrafluoroethylene, 0.5 mil thick, and second dielectric layer 20 comprises KAPTON polyimide, 1.0 mil thick, an Anelva RIE etcher model 506 was used to remove first dielectric layer 18, using a laser dithered second dielectric layer 20 as a mask.

A three step etch sequence was used to produce vias in an integrated circuit (IC) test structure. In the first step, a mixture of 90% $CF_4$ and 10% $O_2$ (total flow of 40 standard cubic centimeters per minute (sccm); power of 500 watts (W); pressure of 155 millitorr (mtorr); time of 10 minutes) was used to remove both soot from the laser dithering operation and remaining residual KAPTON polyimide at the bottom of the via, yielding a clear TEFLON area to etch. This plasma condition resulted in an etch rate ratio of approximately 1:1 for KAPTON polyimide (1370 Å/min) and TEFLON polytetrafluoroethylene (1400 Å/min).

In the second step, a plasma condition with a more selective etch rate ratio to TEFLON polytetrafluoroethylene was used in order to preserve the KAPTON polyimide mask (second dielectric layer 20), while removing the entire thickness of TEFLON polytetrafluoroethylene (first dielectric layer 18) from the bottom of the via. An Ar plasma etch (total flow of 40 sccm; power of 600 W; pressure of 50 mtorr; time of 60 minutes) resulted in an etch rate ratio of approximately 5:1 for TEFLON polytetrafluoroethylene (1120 Å/min) and KAPTON polyimide (200 Å/min).

In the third step, a mixture of 50% $O_2$ and 50% Ar (total flow of 40 sccm; power of 600 W; pressure of 30 mtorr; time of 20 minutes) was used to remove residual TEFLON polytetrafluoroethylene and to thin the upper KAPTON polyimide layer 20 at a fast rate. This plasma condition resulted in an etch rate ratio of approximately 1.25:1 for TEFLON polytetrafluoroethylene (3473 Å/min) and KAPTON polyimide (2780 Å/min).

The three step etch sequence yielded vias with openings approximately 2 mil square, and a final total dielectric film thickness of approximately 1 mil (0.5 mil TEFLON polytetrafluoroethylene and 0.5 mil KAPTON polyimide). After the vias on the IC test sample were open, a top metallization comprising 1000 Å Ti, 4000 Å Cu, 4 μm of electroplated copper and 1000 Å Ti was deposited using conventional sputtering and electroplating techniques. After patterning and etching the upper Ti/Cu/Ti metal, low contact resistance (2–5 milliohms) was measured between the upper Ti/Cu/Ti and the metal pad 14, which generally comprises Al, at the bottom of the via, indicating that dielectric layers 18 and 20 were completely removed from the metal pad and the via was free of residue.

The third step in the etch sequence (as discussed above), can be used in other embodiments to remove or greatly thin second dielectric layer 20, leaving a surface which provides good adhesion to other low dielectric constant layers such as benzocyclobutene (BCB), fluorocarbon polymers such as TEFLON polytetrafluoroethylene, or metal.

Figure 1D:
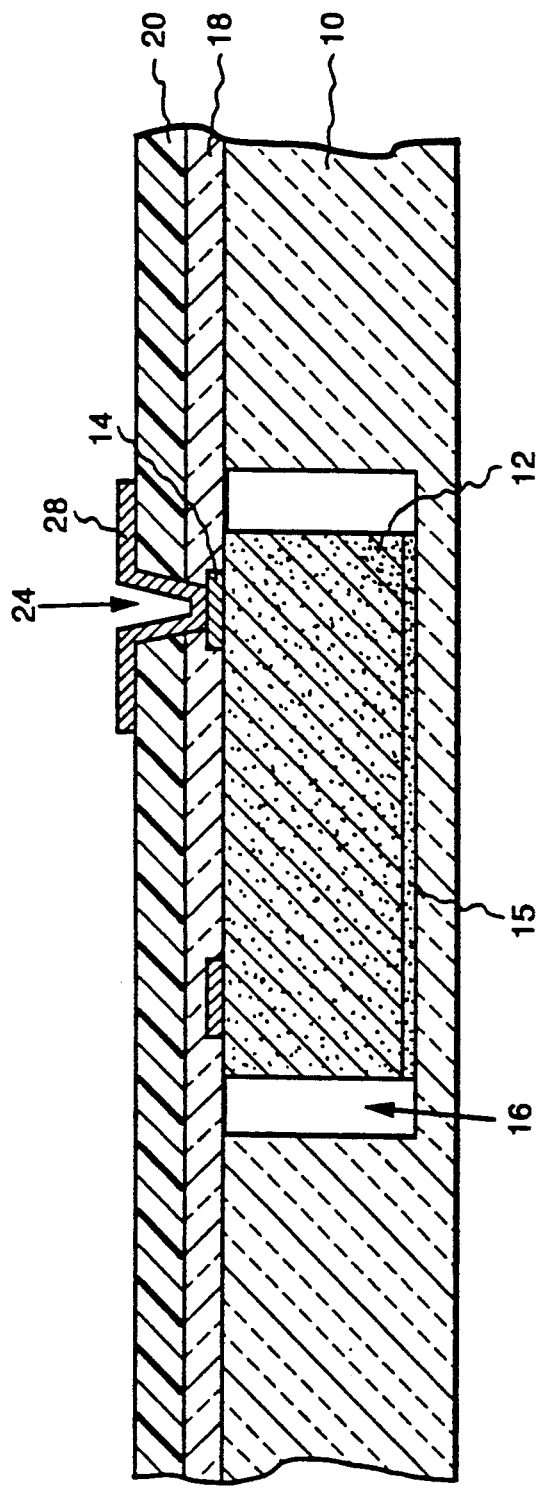
FIG. 1(d) is a view similar to that of FIG. 1(c), with an electrical conductor in the via.

After via 24 is etched, the assembly can be backsputtered, metallized, and patterned as a conventional HDI module. Thus FIG. 1(d) is a view similar to that of FIG. 1(c), with an electrically conducting material 28 now situated in via 24. Aforementioned U.S. Pat. No. 4,783,695 discloses the basic HDI techniques.

Figure 1E:
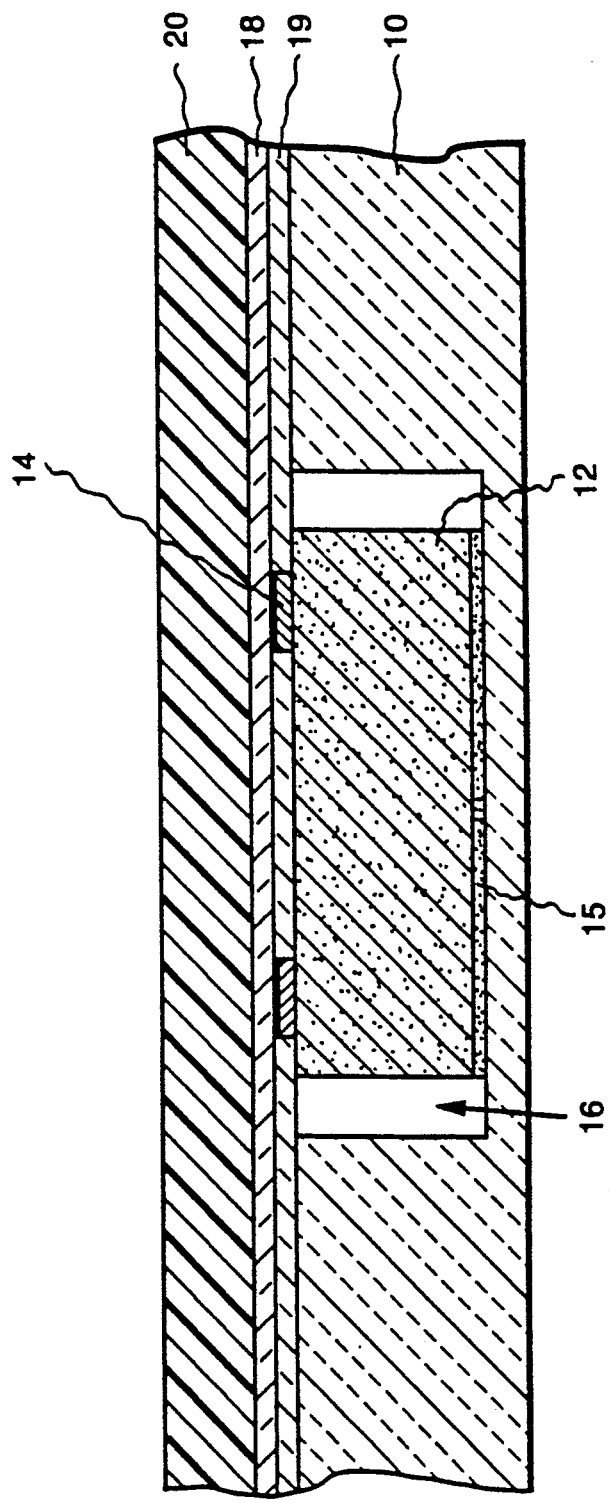
FIG. 1(e) is a view similar to that of FIG. 1(a), with a third dielectric layer situated between the first dielectric layer and the chip.

FIG. 1(e) is a view similar to that of FIG. 1(a), with a third dielectric layer 19 situated between first dielectric layer 18 and chip 12. In certain instances during lamination, adhesives such as first dielectric layer 18, in the embodiment shown in FIGS. 1(a)–1(d), can flow, resulting in non-uniform adhesive thickness and thus in non-uniform dielectric layers after processing. The use of first dielectric layer 18 and second dielectric layer 20 (which acts as a mask), such as type XP type Dupont film composite laminates, may be enhanced in usage by inserting a third dielectric layer 19 which has a low dielectric constant and lower melting point than first layer 18 (which also has a low dielectric constant) between the first layer and the substrate. This structure may comprise, for example, a Dupont type FEP TEFLON polytetrafluoroethylene that is placed as a film (or prelaminated to an XP double laminate film) under the type XP film. When the HDI lamination occurs, the FEP TEFLON polytetrafluoroethylene may melt, flow, or be forced away by the lamination process at corners of the die or other sharp edged areas. The use of two layers of TEFLON polytetrafluoroethylene, or two layers of other low dielectric constant films, with differing melting points provides a guaranteed minimum thickness of material between chip 12 and dielectric layers 18 and 20, thus providing uniform dielectric properties.

Figure 3A:
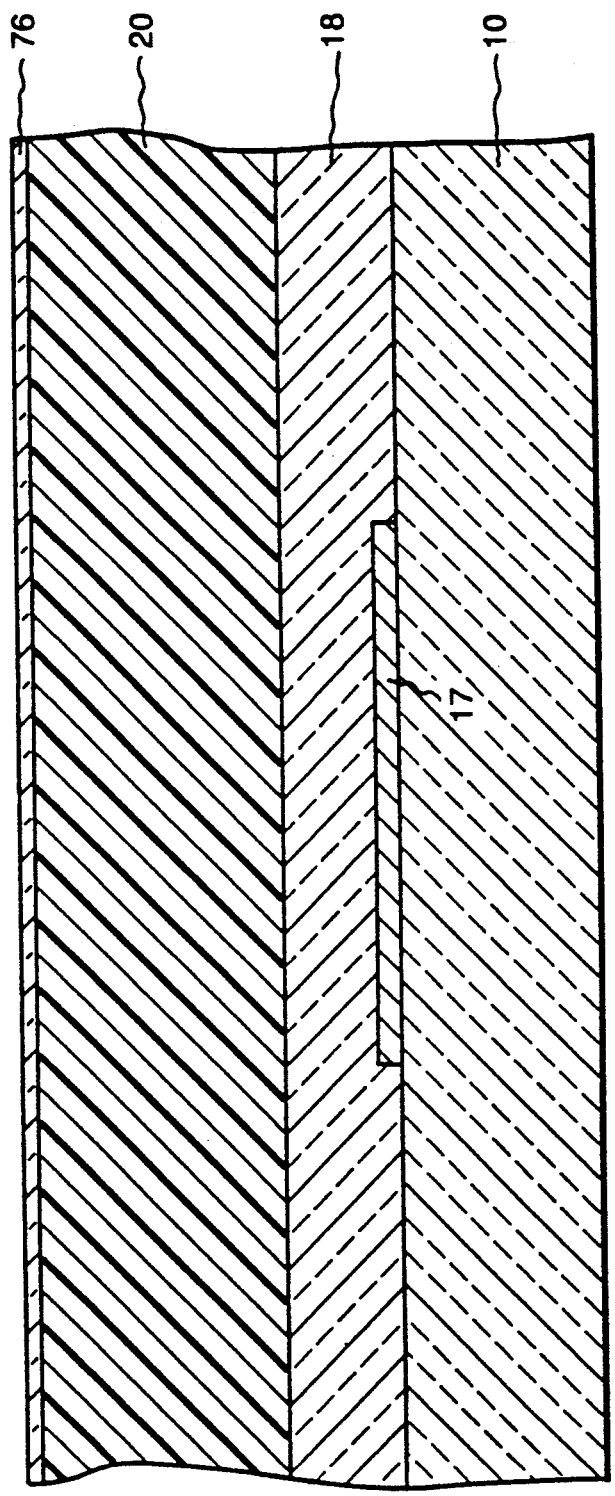
FIG. 3(a) is a sectional side view a first dielectric layer overlying an electrically conductive contact, a second dielectric layer overlying the first dielectric layer, and a hard mask overlying the second dielectric layer.

In another embodiment, if desired, second dielectric layer 20 may be replaced by any appropriate masking material which can be removed without damaging the module, such as, for example, an electrically conductive material. Alternatively, a hard mask 76 (shown in FIG. 3(a)) may be added to the configuration of FIG. 1(e), as discussed infra.

Figure 2:
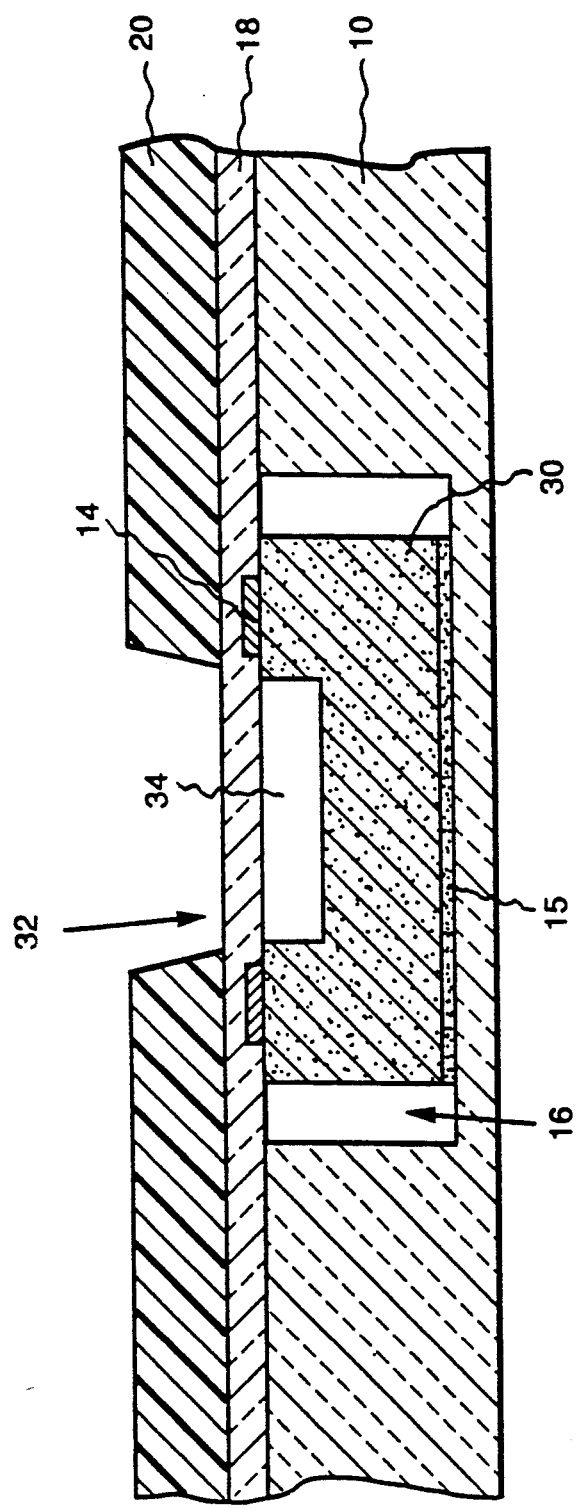
FIG. 2 is a sectional side view of a first dielectric layer overlying a chip in a substrate well, and a second dielectric layer overlying the first dielectric layer, with a laser ablated window through the second dielectric layer exposing the first dielectric layer over a damage sensitive area of the chip.

The techniques discussed with respect to FIGS. 1(a)-1(e) are not limited to the via hole context. FIG. 2 is a sectional side view of a laser ablated window 32 in second dielectric layer 20, overlying first dielectric layer 18, overlying a chip 30 in well 16 in substrate 10. The laser ablated window through second dielectric layer 20 is situated over a damage sensitive area 34, such as a video array area or a high frequency area. Localized ablation and video array processing need special care so as not to damage the chip surface. A laser may be used to locally ablate second dielectric layer 20 down to first dielectric layer 18. This is usually sufficient for optical and dielectric constraints, especially because a video array is preferably covered by a protective layer to prevent damage. If the laser process or RIE has affected the optical clarity of first dielectric layer 18, optical clarity may be adjusted with localized heat reflow, which smooths the surface of first dielectric layer 18 in window 32.

In another embodiment, shown in FIGS. 3(a)-3(d), the configurations of FIGS. 1(a)-1(d) further include a hard mask 76 which overlies first dielectric layer 18 and second dielectric layer 20. Metal contact 17 may be either a chip pad or a selected portion of an electrically conductive interconnect pattern. In one embodiment, shown in FIG. 3(a), hard mask 76, an oxygen plasma resistant layer, preferably transparent, is deposited on top of an HDI module (not shown) after application of dielectric layers 18 and 20. Silicon nitride is one useful material for hard mask 76 because the nitride mask is transparent to allow visual alignment to the substrate during via dither; it has good adhesion to polymer surfaces; it has a very low erosion rate during polymer etching; and it is easily removed. The nitride film is deposited from silane and ammonia source gases using low pressure, plasma enhanced chemical vapor deposition at 200° C. This technique is compatible with other HDI processing steps.

Figure 3B:
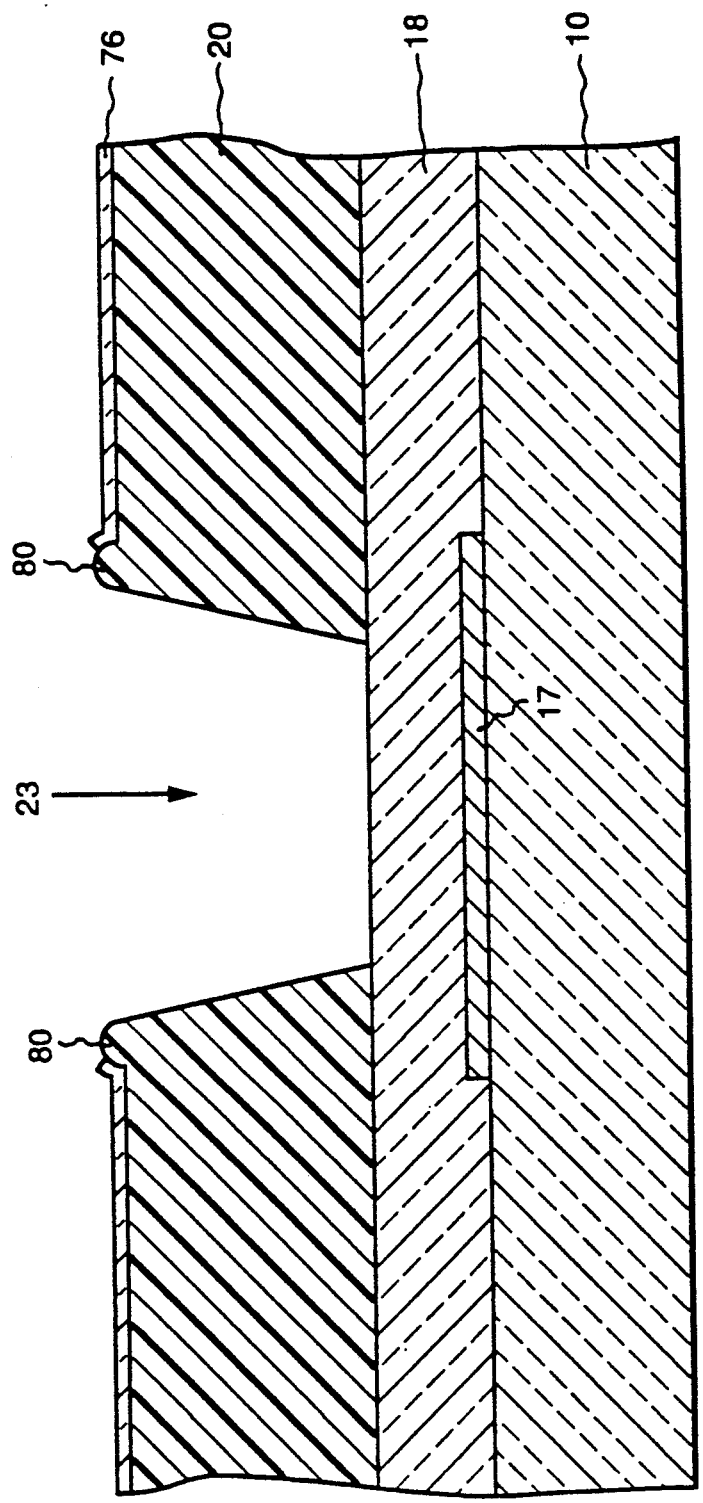
FIG. 3(b) is a view similar to that of FIG. 3(a), with a laser dithered hole through the hard mask and second dielectric layer, showing a ridge in the second dielectric layer.

After depositing the nitride layer (hard mask 76), laser dithering for via formation is performed as discussed with reference to FIG. 1(b), and dielectric ridge 80 is formed, as shown in FIG. 3(b). The nitride film is removed at the same time and in the same area during the laser ablation of second dielectric layer 20 directly over 23, as shown in FIG. 3(b).

Figure 3C:
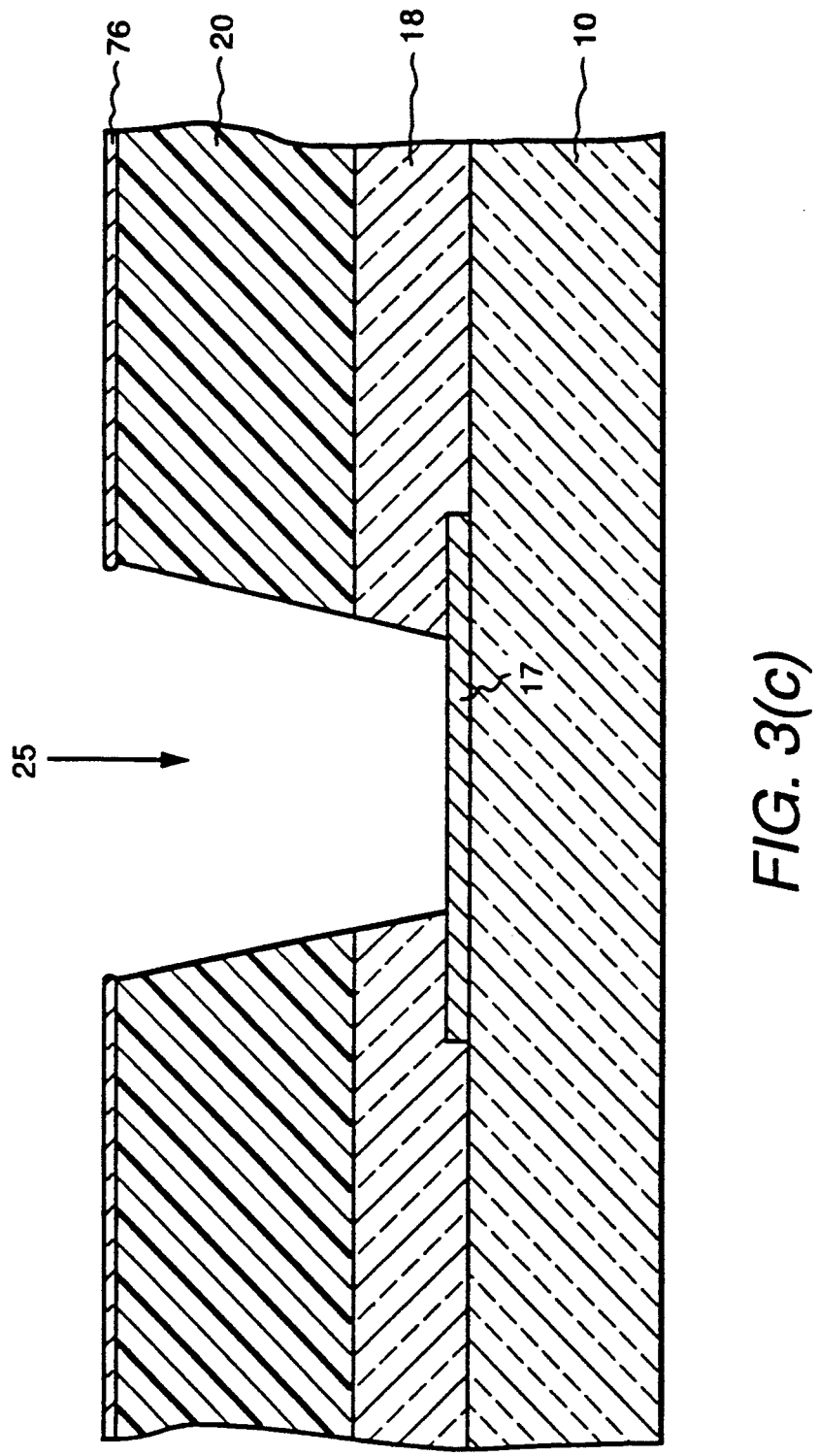
FIG. 3(c) is a view similar to that of FIG. 3(b), with the laser dithered hole extending through the first dielectric layer and the dielectric ridge removed.

Next, first dielectric layer 18 may be etched in the same manner as discussed with respect to FIG. 1(c), leaving a via opening 25, shown in FIG. 3(c), extending through dielectric layers 18 and 20 to metal contact 17. In this manner, hard mask 76 can be used as a mask to plasma etch out the remainder of the polymer in the via without decreasing the total thickness of second dielectric layer 20. Hard mask 76 thus provides uniform dielectric layers with controlled thicknesses, enabling better impedance matching for stripline devices. Additionally, ridge 80 is subsequently removed during the etch of first dielectric layer 18.

Figure 3D:
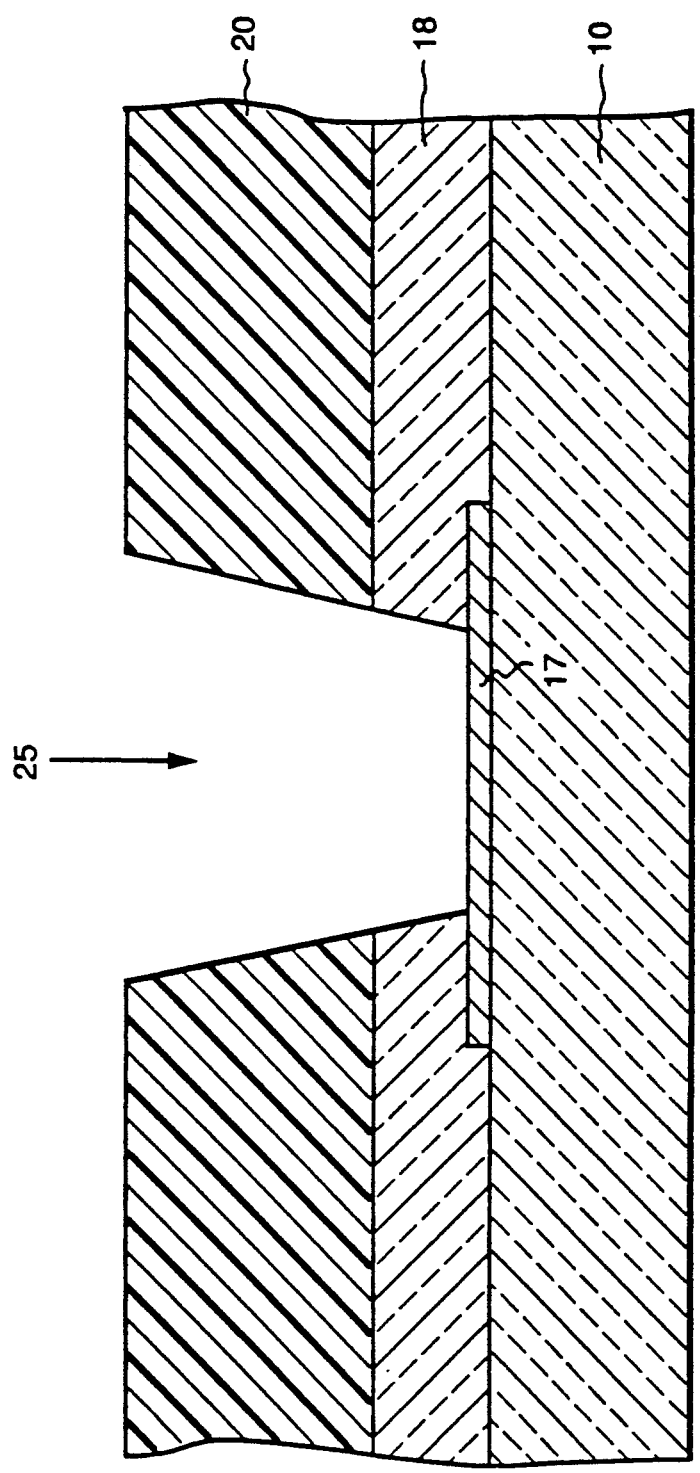
FIG. 3(d) is a view similar to that of FIG. 3(c), with the hard mask layer removed.

A second etch process removes hard mask 76 from the surface of second dielectric layer 20, as shown in FIG. 3(d). For a silicon nitride mask, this can be performed with RIE using a mixture of 90% $CF_4$ and 10% $O_2$ (total flow of 39 sccm; power of 400 W; and pressure of 155 mtorr). The HDI module is then ready for continuation of fabrication, with no additional cleaning required. Additionally, this etch promotes good adhesion between the surface of second dielectric layer 20 and subsequent sputtered metal layers (not shown). Both the polymer ridge removal and hard mask removal etch steps can be done consecutively in a RIE system for ease of implementation.

Figure 4A:
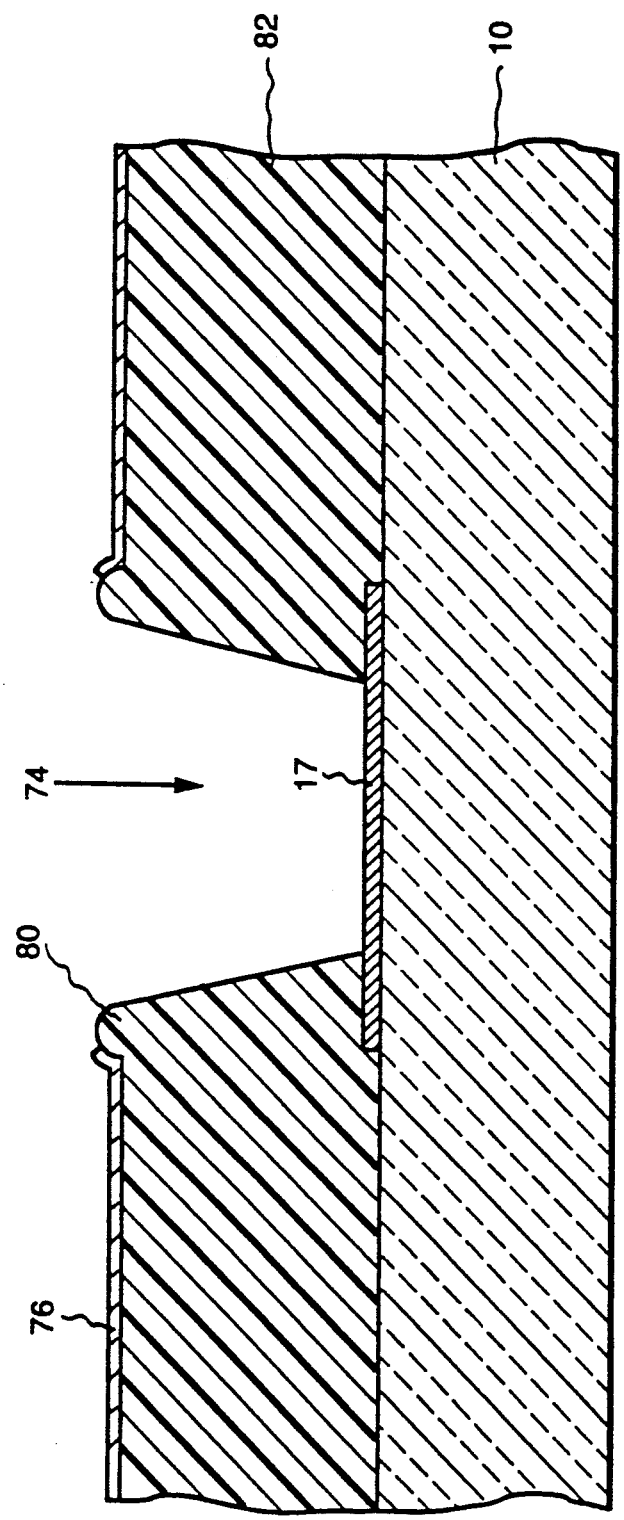
FIG. 4(a) is a sectional side view of a via showing a dielectric ridge and a layer of hard mask.
Figure 4B:
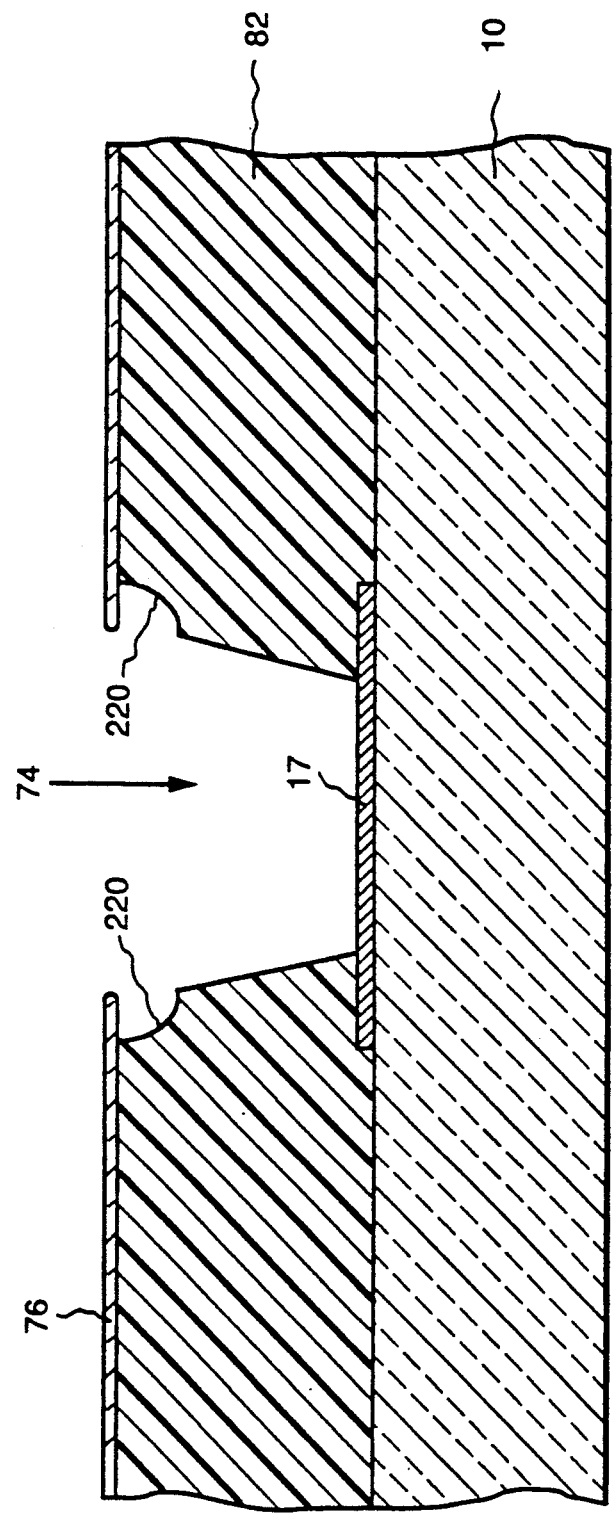
FIG. 4(b) is a view similar to that of FIG. 4(a), with the dielectric ridge etched out.
Figure 4C:
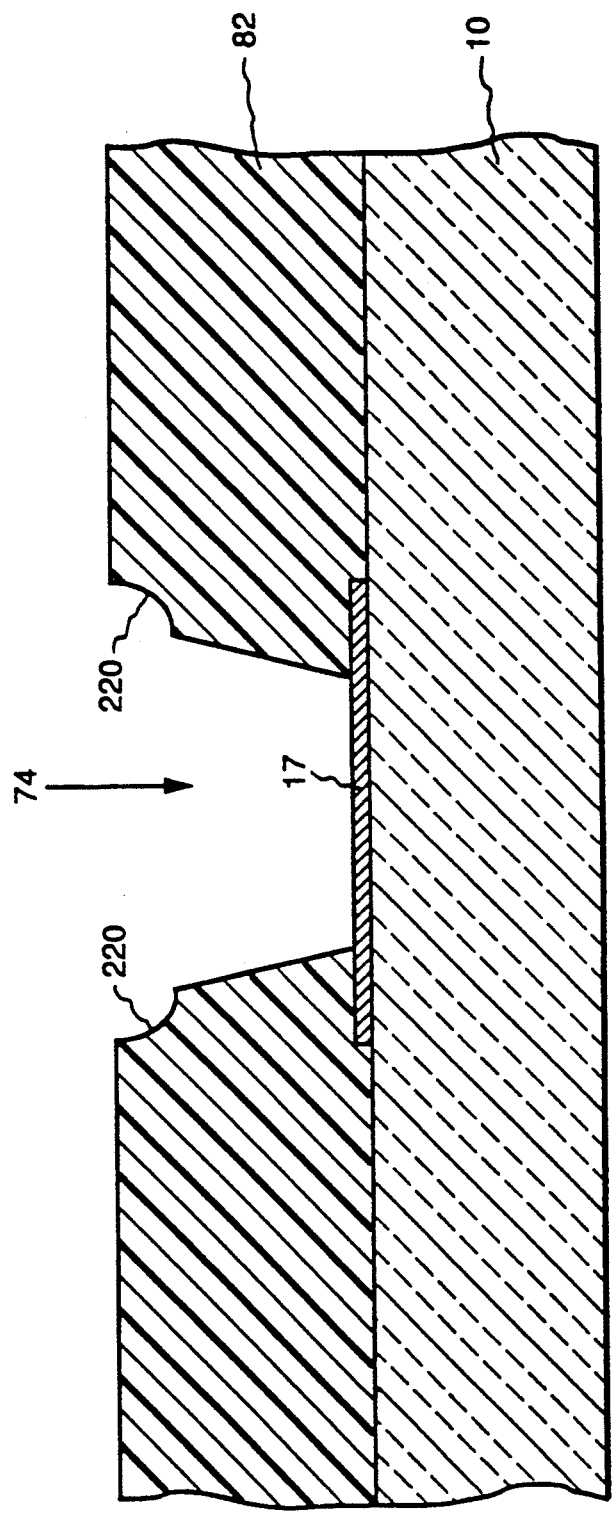
FIG. 4(c) is a view similar to that of FIG. 4(b), with the hard mask removed.

A hard mask layer 76, as discussed with respect to FIGS. 3(a)-3(d), is also useful for removing polymer dielectric ridges which may form during via fabrication by laser dithering layers that are laser ablatable. FIGS. 4(a) through 4(c) illustrate a process for removing a dielectric ridge 80 formed during laser dithering of dielectric layer 82, which in one embodiment comprises KAPTON polyimide. FIG. 4(a) is a view showing the ridge that results from dithering. FIG. 4(b) is a view of the via 74 which results after a short isotropic etch in a barrel type etcher using 9% $CF_4$ and 91% $O_2$ (total flow 600 sccm; power of 150 W; and pressure of 750 mtorr). The etch process isotropically etches the exposed KAPTON polyimide selective to the hard mask, effectively undercutting the hard mask surrounding the vias, and completely removing the polymer dielectric ridge. Because the isotropic etch process etches more dielectric at the opening of the via than in the chip pad area, a taper 220 is created, the size and nature of which depend on the plasma pressure. The taper can thus be designed to obtain improved metal step coverage. FIG. 4(c) is a view after the hard mask shown in FIG. 4(b) has been removed in the same manner as discussed with respect to FIG. 3(d).

Figure 5A:
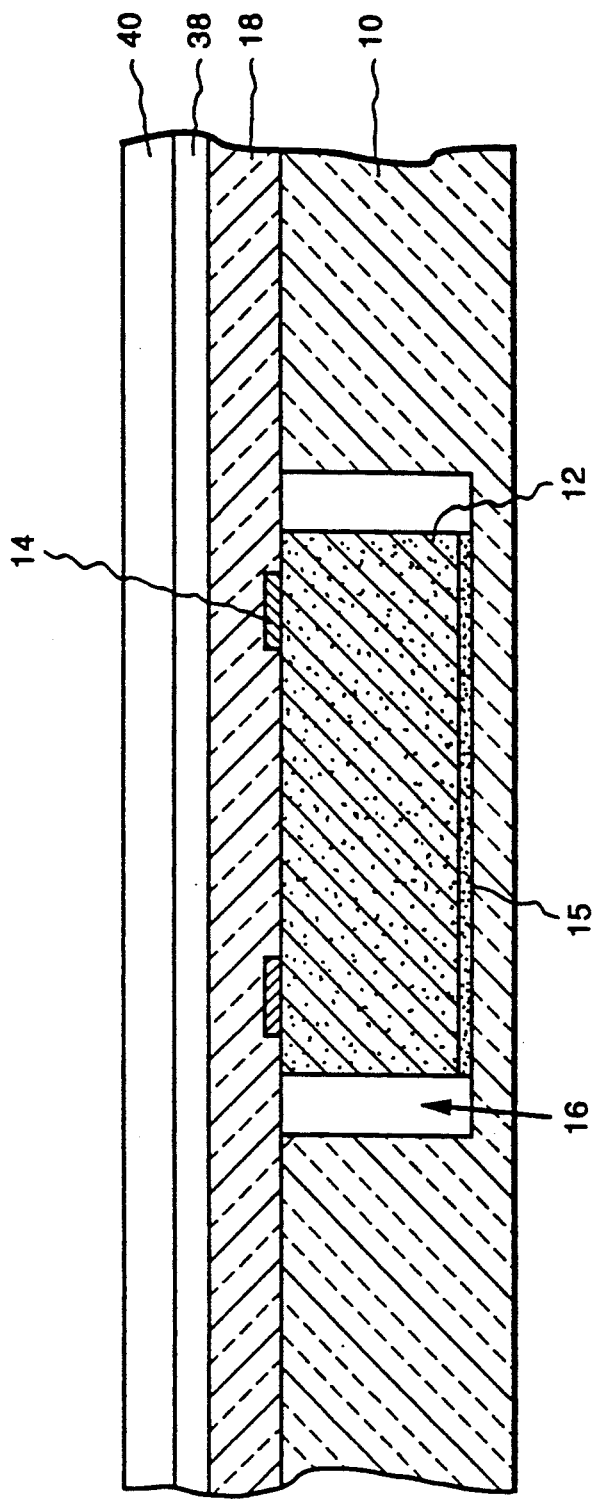
FIG. 5(a) is a sectional side view of a chip having chip pads in a substrate well covered by a dielectric layer covered by an inert mask covered by a layer of photoresist.

As shown in FIG. 5(a), patterning low dielectric constant layers may be performed by using an inert mask layer 38 comprising metals or other hard materials such as nitrides or oxides rather than a polymeric dielectric layer 20 (shown in FIGS. 1(a)-1(d)). The inert mask material is chosen so that it will not react during the etching of the low dielectric constant layer. FIG. 5(a) is a sectional side view of chip 12 in a substrate 10, in well 16 covered by low dielectric constant layer 18, which, in turn, is covered by a layer of inert mask material 38, which itself is covered by a layer of photoresist 40. A KAPTON polyimide/TEFLON polytetraflouroethylene layer may be laminated as discussed with respect to FIG. 1(a). The entire KAPTON polyimide portion can be removed using RIE or other plasma or chemical treatments. It is preferable to leave a thin film of KAPTON polyimide (not shown) on the TEFLON polytetrafluoroethylene layer to improve mask adhesion. Concentrated $H_2SO_4$, NaOH, etc., may be used in lieu of RIE and will etch KAPTON polyimide quickly. These treatments may shorten RIE time and protect the circuit during this processing. Alternatively, low dielectric constant layer 18 may be applied as the only dielectric layer, although applying TEFLON polytetrafluoroethylene alone is more difficult than using a prefabricated double layer film such as KAPTON polyimide/TEFLON polytetrafluoroethylene.

In one embodiment inert mask 38 comprises a metal mask. The module can be metallized with 1000 Å titanium/tungsten (TiW) or titanium (Ti), for adhesion, and metallized with 1000–4000 Å of molybdenum, for example. The thickness depends on the surface finish and topography of the module being processed. The object is to use a metal system that is non-reactive in the etch chemistry used to remove the dielectric material. The metal inert mask also needs to be removed selective to Al chip pads. The metallized module is coated with a photoresist and patterned with adaptive lithography (both these techniques are disclosed in aforementioned U.S. Pat. No. 4,835,704).

Figure 5B:
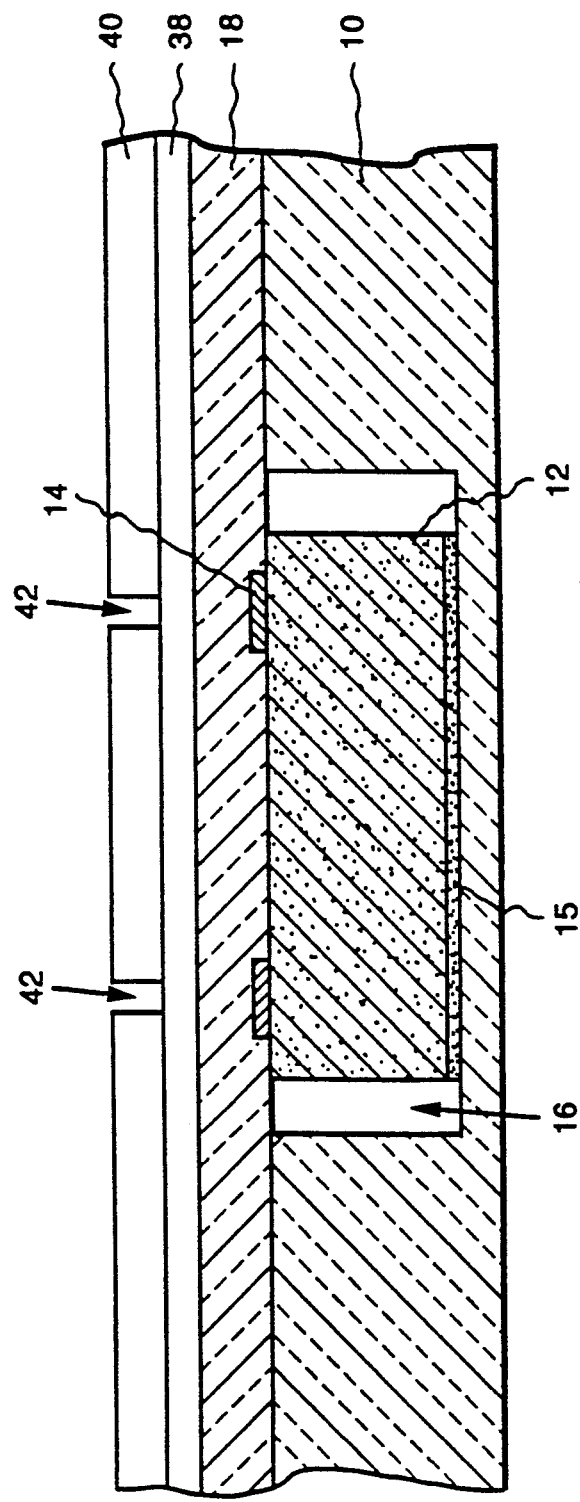
FIG. 5(b) is a view similar to that of FIG. 3(a), with vias patterned through the layer of photoresist.
Figure 5C:
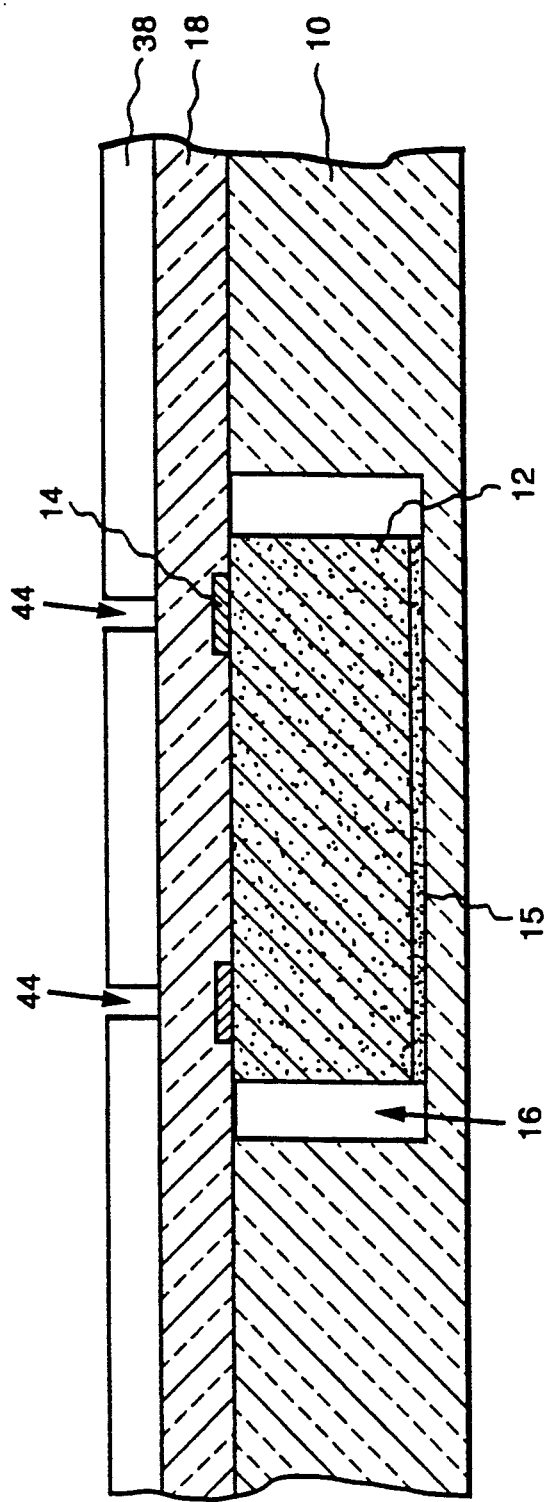
FIG. 5(c) is a view similar to that of FIG. 3(b), with vias patterned through the inert mask and the layer of photoresist removed.

The photoresist is developed and rinsed, resulting in a pattern with openings 42 as shown in FIG. 5(b). The metal mask is then etched to create openings 44 and the photoresist is removed to expose the low dielectric constant layer 18 to be etched, as shown in FIG. 5(c). In the embodiment with a low dielectric constant layer 18 of TEFLON polytetrafluoroethylene, the via 44, shown in FIG. 5(d), can be etched using a mixture of 50% $O_2$ and 50% Ar, as described with reference to FIG. 1(c). Unlike second dielectric layer 20 in the approach described in conjunction with FIGS. 1(a)–1(c), which dimensionally changes during the etching to a small degree, the dimensions of the inert mask do not change except for the issue of undercutting in the etch process. The fixed, integral HDI adaptive lithography method produces a very reliable mask.

Figure 5D:
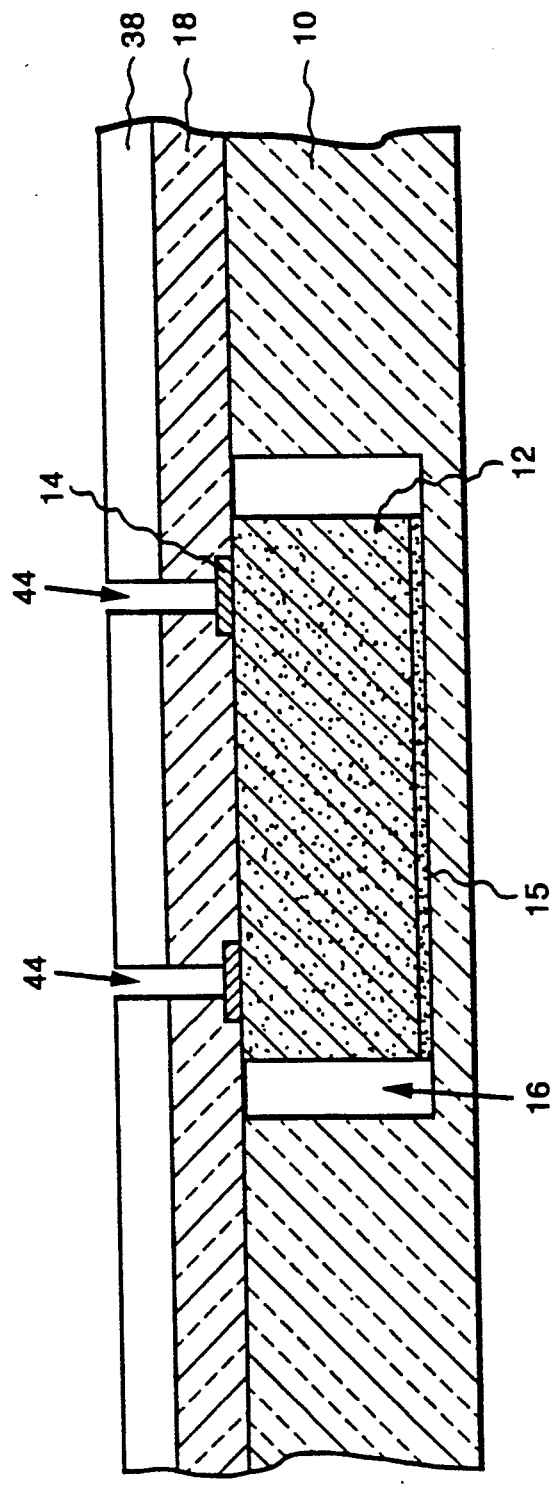
FIG. 5(d) is a view similar to that of FIG. 3(c), with vias patterned through both the inert mask and the dielectric layer.
Figure 5E:
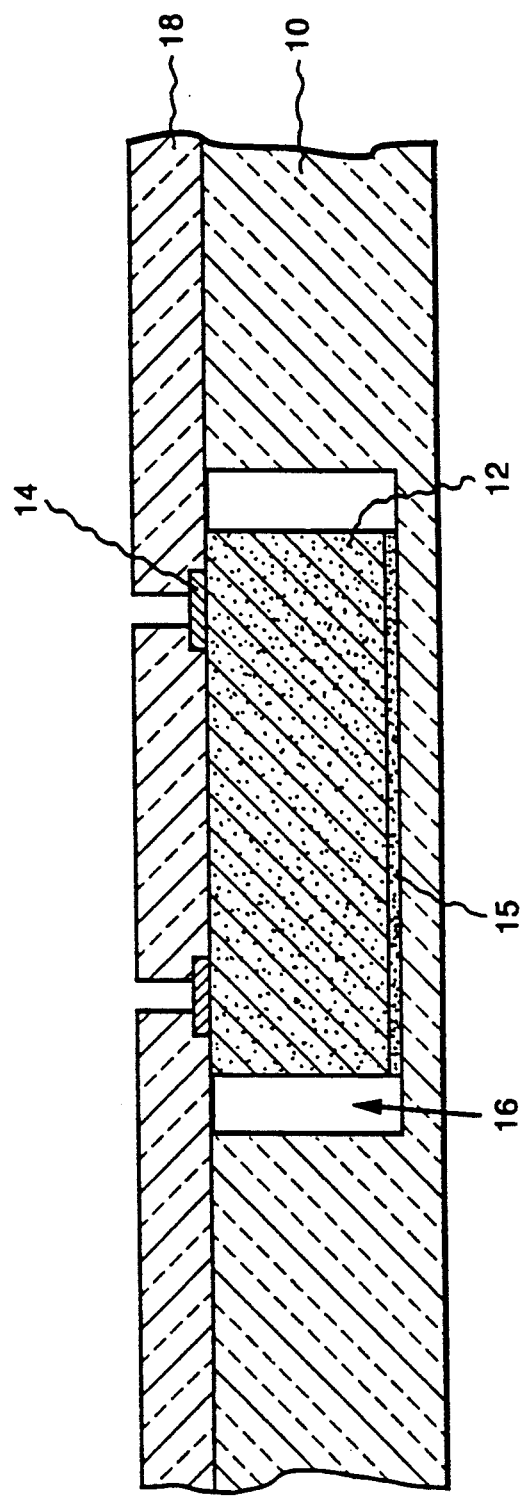
FIG. 5(e) is a view similar to that of FIG. 3(d), with the inert mask removed.
Figure 5F:
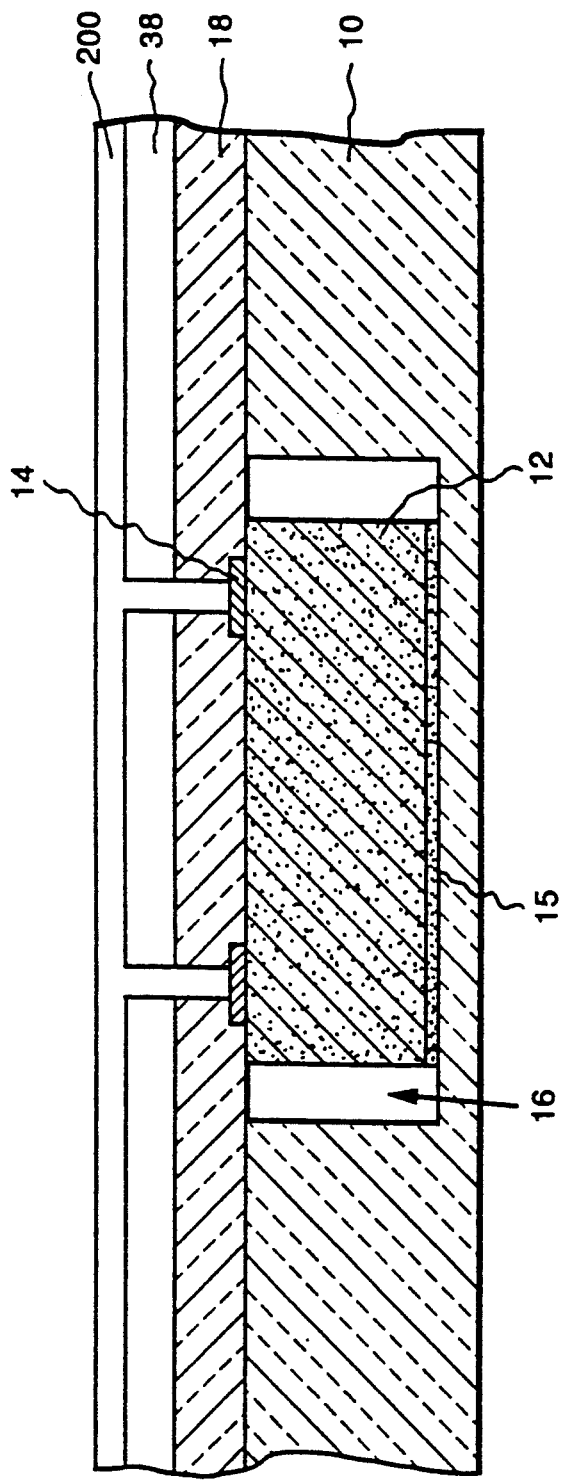
FIGS. 5(f)-5(h) are views showing a process for removing the inert mask shown in FIG. 5(d) without damaging the chip pads.
Figure 5G:
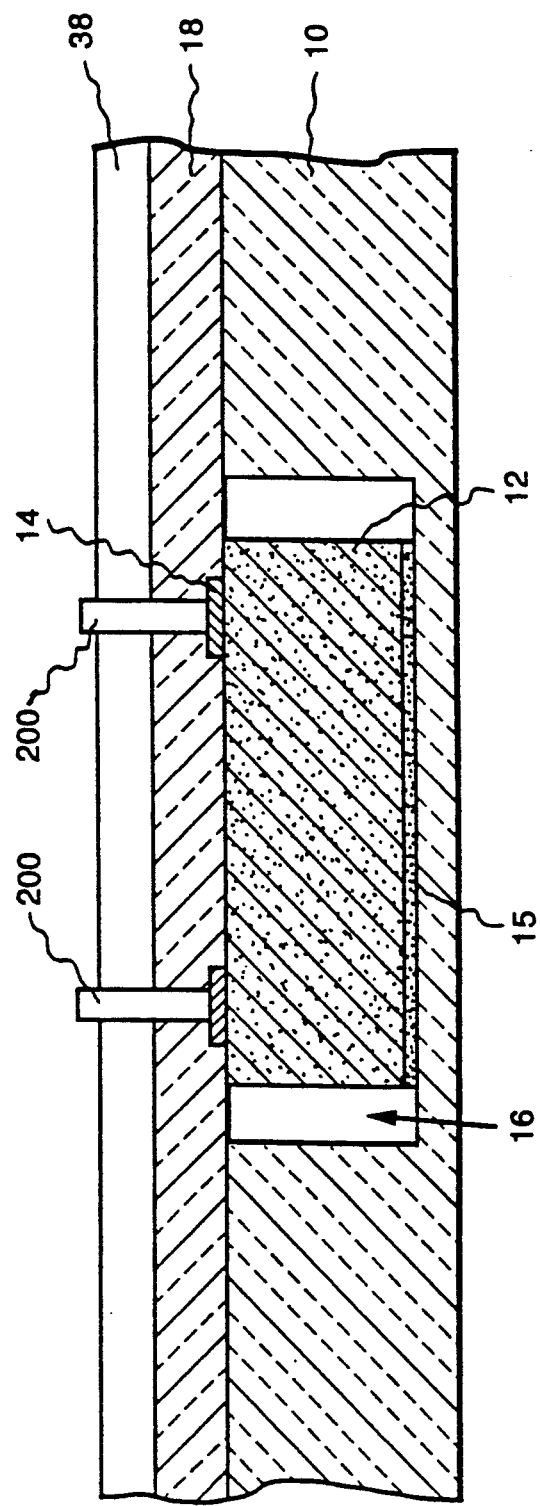
Figure 5H:
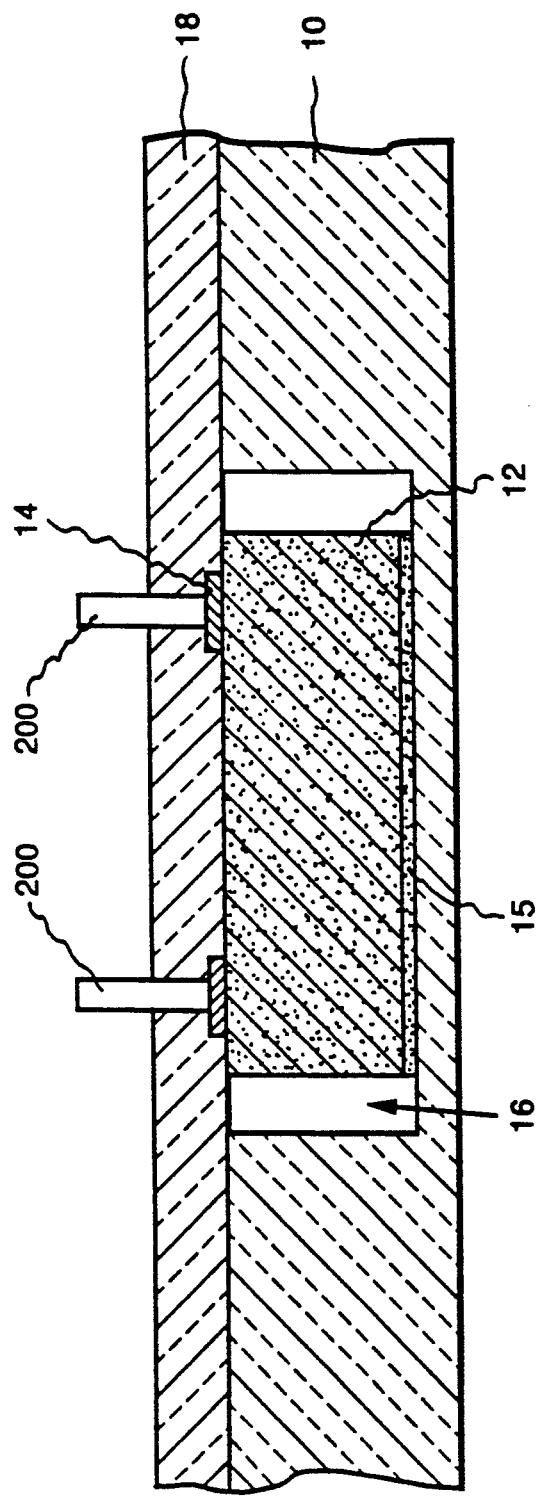

FIG. 5(e) is a view similar to that of FIG. 5(d), with the inert mask removed. If the inert mask is a metal such as Ti/Mo or TiW/Mo, it can be removed selectively to the Al chip pads 14 with RIE using a mixture of 70% $SF_6$ and 30% $O_2$ (total flow 60 sccm; power 300 W; and pressure 65 mtorr). If other metals such as Ti/Al are used as the mask, chip pads 14 must be protected from the mask etch. One protection process is to re-photoresist the module with photoresist layer 200 (shown in FIG. 5(f)) and use the HDI adaptive lithography system, disclosed in aforementioned U.S. Pat. No. 4,835,704, to selectively expose and then develop the photoresist so as to leave resist only in the vias, as shown in FIG. 5(g). After etching off inert mask 38, as shown in FIG. 5(h), the resist is removed from the via holes, and the module is ready for Ar ion sputter cleaning and metallization.

Another method for protecting chip pads during the inert mask etch is to stop the RIE prior to completion of the via etch and remove the mask, using low dielectric constant layer 18 as the etch mask. The module is then returned to the RIE process and etched to via completion. This process completely etches the via and also differentially etches the thickness of the remaining low dielectric constant layer. 18 everywhere else.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating an opening in a layer of a dielectric material which is not itself laser ablatable at a predetermined laser wavelength, comprising the steps of:

providing a first dielectric layer the non-ablatable dielectric material;

providing a second dielectric layer of another material which is laser ablatable at the predetermined laser wavelength, over said first dielectric layer;

applying a hard mask over the second dielectric layer;

providing an opening in the hard mask;

laser ablating a corresponding opening in the second dielectric layer though the mask opening;

then providing in the first dielectric layer an opening aligned with the opening in the second dielectric layer, by reactive ion etching performed so that any dielectric ridge formed around the second dielectric layer opening is removed; and removing the hard mask after providing the first dielectric layer opening.

2. A method for removing a dielectric ridge formed around a via surface in a dielectric layer, comprising the steps of:

applying a hard mask over the dielectric layer;

laser dithering a via through the hard mask and the dielectric layer such that a portion of the dielectric layer is left unprotected by the mask; and isotropically etching the unprotected portion of the dielectric layer with control to taper the dielectric ridge around the via surface; and then removing the hard mask from the dielectric layer.

* * * * *